United States Patent
Minesawa (10) Patent No.: US 12,512,832 B2
(45) Date of Patent: Dec. 30, 2025

(54) SEMICONDUCTOR DEVICE AND CONTROL SYSTEM

(71) Applicant: RENESAS ELECTRONICS CORPORATION, Tokyo (JP)

(72) Inventor: Ryutaro Minesawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 399 days.

(21) Appl. No.: 18/177,469

(22) Filed: Mar. 2, 2023

(65) Prior Publication Data

US 2024/0297645 A1  Sep. 5, 2024

(51) Int. Cl.
  H03K 17/56 (2006.01)
  B60R 16/03 (2006.01)
  H02M 1/08 (2006.01)
  H03K 5/156 (2006.01)

(52) U.S. Cl.
  CPC .......... *H03K 17/56* (2013.01); *B60R 16/03* (2013.01); *H02M 1/08* (2013.01); *H03K 5/1565* (2013.01)

(58) Field of Classification Search
  CPC ...... H03K 17/56; H03K 5/1565; B60R 16/03; H02M 1/08
  See application file for complete search history.

(56) References Cited

U.S. PATENT DOCUMENTS

| | | | | |
|---|---|---|---|---|
| 9,959,899 | B2 * | 5/2018 | Kita | H04L 25/0272 |
| 10,193,457 | B1 * | 1/2019 | Hande | H02M 1/36 |
| 10,721,055 | B2 | 7/2020 | Ikeda | |
| 2013/0055052 | A1 * | 2/2013 | Kaeriyama | H04B 5/22 |
| | | | | 714/799 |

FOREIGN PATENT DOCUMENTS

JP  2019-212956 A  12/2019

* cited by examiner

*Primary Examiner* — Kyle J Moody
(74) *Attorney, Agent, or Firm* — Rimon P.C.

(57) ABSTRACT

A semiconductor device includes first and second isolators, a first transmitting circuit that transmits a transmission signal via the first isolator, a first receiving circuit that receives a received signal corresponding to the transmission signal via the first isolator, an output driver that outputs a drive signal for driving a power device based on the received signal, a timer that inputs first and second signals having first and second information associated with the power device, respectively, and outputs a third signal from the first and second information, a second transmitting circuit that transmits the third signal via the second isolator and a second receiving circuit that receives a signal corresponding to the third signal via the second isolator.

13 Claims, 11 Drawing Sheets

| Error factor | | | | Condition | Countermeasure | No. |
|---|---|---|---|---|---|---|
| MCU side (primary side) | 1. Power failure (UV/OV) | | | 5V -> 8V | Motor control stop | 1-1 |
| | | | | 5V -> 6V | Power save mode | 1-2 |
| | | | | 5V -> 4.1V | Power save mode | 1-3 |
| | | | | 5v -> 3V | Motor control stop | 1-4 |
| Power device side (secondary side) | 2. Positive power failure (UV/OV) | | | 15V -> 28V | Motor control stop | 2-1 |
| | | | | 15V -> 18V | Power save mode | 2-2 |
| | | | | 15V -> 11V | Power save mode | 2-3 |
| | | | | 15V -> 8V | Motor control stop | 2-4 |
| | 3. Negative power failure (UV/OV) | by individual voltage | | -8V -> -24V | Motor control stop | 3-1 |
| | | | | -8V -> -12V | Power save mode | 3-2 |
| | | | | -8V -> -2V | Power save mode | 3-3 |
| | | | | -8V -> 0V | Motor control stop | 3-4 |
| | | | by potential difference | 15V+\|-24V\|=39V | Motor control stop | 3-5 |
| | | | | 15V+\|-12V\|=27V | Power save mode | 3-6 |
| | 4. Temperature | | | > 140 degree | Power save mode | 4 |
| | 5. Short circuit | | | Special condition | Motor control stop | 5 |

FIG. 11

SEMICONDUCTOR DEVICE AND CONTROL SYSTEM

BACKGROUND

The present invention relates to a semiconductor device and a control system using a galvanic isolator.

Power transistors (power MOSFET and IGBT) are used in high-voltage devices such as motors, power converters, and illuminators. On the other hand, MCU (Micro Controller Unit) controlling the power transistor operates at a low voltage. A galvanic isolator (hereinafter referred to as an isolator) such as a capacitor or a transformer is used for such communication between the power transistor and MCU.

In recent years, with the popularization of electric vehicles (EV) and hybrid electric vehicles (HEV), miniaturization of systems using isolators has been demanded.

A technique of applying SPI (Serial Peripheral Interface) using an isolator to communication between a MCU and a power device is disclosed in Patent Document 1.

Prior-Art Document

Patent Document

[Patent Document 1] Japanese Unexamined Publication Laid-Open No. 2019-212956

SUMMARY

With an increase in the number of electronic systems mounted on an automobile, a high degree of functional safety is required for an in-vehicle electronic system. Further, in recent years, in order to improve usability of a user, it has been required to continue traveling of a vehicle by causing a vehicle-mounted electronic system to perform a degenerate operation without immediately stopping the vehicle when a failure occurs in the vehicle-mounted electronic system. For this purpose, when a failure occurs, it is necessary to identify a failure location and determine whether or not the failure does not affect the vehicle running. This also applies to an isolator-built-in gate driver IC for driving a xEV inverter, a Boost/Buck converter, a DC/DC converter, or the like including the power transistor.

A technique for performing SPI communication between a MCU and a power device is disclosed in Patent Literature 1. According to this technique, MCU can acquire the sensor data included in the power device through SPI communication. By obtaining the sensor data, MCU can determine the state of the power device. However, at least two communication paths including isolators are required for SPI communication, and the gate driver IC is expensive.

Other objects and novel features will become apparent from the description of the specification and drawings.

A semiconductor device according to an embodiment includes first and second isolators, a first transmitting circuit that transmits a transmission signal via the first isolator, a first receiving circuit that receives a received signal corresponding to the transmission signal via the first isolator, an output driver that outputs a drive signal for driving a power device based on the received signal, a timer that inputs first and second signals having first and second information associated with the power device, respectively, and outputs a third signal from the first and second information, a second transmitting circuit that transmits the third signal via the second isolator and a second receiving circuit that receives a signal corresponding to the third signal via the second isolator. According to the present disclosure, the area of the power transistor control circuitry can be greatly reduced, and IC of the gate driver can be reduced.

DETAILED DESCRIPTION

Hereinafter, a semiconductor device and a control system according to an embodiment will be described in detail with reference to the drawings. In the specification and the drawings, the same configuration elements or corresponding constituent elements are denoted by the same reference numerals, and redundant descriptions thereof will be omitted. In addition, in the drawings, configurations may be omitted or simplified for convenience of explanation. At least some of the embodiments may be arbitrarily combined with each other.

First Embodiment

Figure 1:
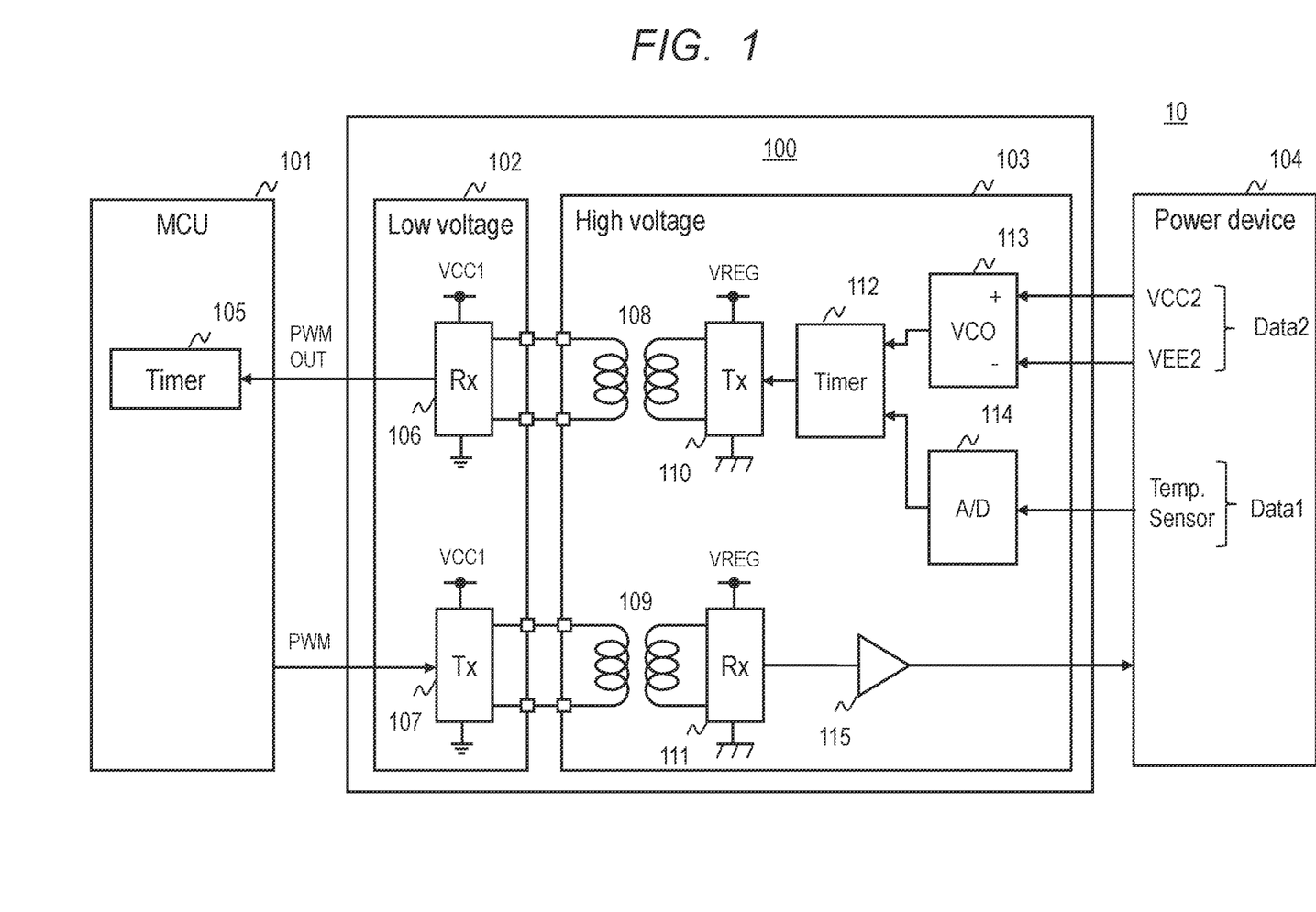
FIG. 1 is a block diagram of a semiconductor device according to a first embodiment.

FIG. 1 is a block diagram of a power device control system 10 using a semiconductor device (gate driver) 100 according to first embodiment. The gate driver 100 is coupled between MCU 101 and the power device 104. The gate driver 100 generates a drive signal for the power device 104 by control from MCU 100, e.g., PWM (Pulse Width Modulation). Further, the gate driver 100 has a function of transmitting information on the power supply voltage VCC2 and the negative voltage VEE2 for driving the power device 104 and information on the temperature sensor included in the power device 104 to MCU 101.

The gate driver 100 comprises a primary circuit 102 operating in a low voltage VCC1 (e.g., 5V) and a secondary circuit 103 operating in a high voltage VCC2 (e.g., 15V). The primary-side circuit 102 includes a receiving circuit (Rx) 106 and a transmitting circuit (Tx) 107. The secondary circuit 103 includes isolators 108 and 109, a transmitting circuit 110, a receiving circuit 111, a timer 112, a VCO (Voltage Controlled Oscillator) 113, A/D converter 114, and a driver circuit 115. The primary circuit 102 and the secondary circuit 103 are separated by isolators 108 and 109. Isolators 108 and 109 are transformers here. The timer 112, VCO 113, A/D converter 114, and the driver 115 are supplied with a power supply voltage VCC2 as an operating voltage. The transmitting circuit 110 and the receiving circuit 111 are supplied with a power supply voltage VREG (e.g., 5V) as an operating voltage.

MCU 101 includes a timer 105. Note that MCU 101 has a CPU, memories, and the like as in the common MCU, but only the timer 105 characteristic in the first embodiment is illustrated in FIG. 1.

As described above, the power device 104 is a xEV inverter, a Boost/Buck converter, a DC/DC converter, or the like configured by a power transistor (not shown). The power supply voltage VCC2 and the negative voltage VEE2 (e.g., −8V) are used as control voltages supplied to a gate of the power transistor. For example, VCC2 is supplied to the gate when the power transistor is turned on, and the negative voltage is supplied to the gate when the power transistor is turned off. The device 104 includes a temperature sensor (not shown) comprising of diode or the like.

Next, the operation of the power device control system 10 will be described. First, a basic operation of the power device control system 10 will be described.

MCU 101 provides, for example, a PWM control signal to the gate driver 100 so that the power device 104 operates as desired. PWM control signal transmitted from MCU 101 is transmitted by the transmitting circuit 107 to the receiving circuit 111 via the isolator 109. PWM control signal received by the receiving circuit 111 is transmitted to the power device 104 by the driver circuit 115 and is applied to the gate of the power transistor. The power transistor supplies a current to a load (such as a motor, not shown) connected to the power device 104 by applying a gate signal. The above-described basic operations are general in the power device control system, and further detailed description thereof will be omitted.

Next, information transmission related to the power device 104, which is a feature of the first embodiment, will be described. As described above, in order for MCU 101 to determine the state of the power device 104, various types of information of the power device 101 are required. In the first embodiment, voltage information of the power supply voltage VCC2 and the negative voltage VEE2 supplied to the power device and temperature information of the temperature sensor are exemplified as the various types of information.

The power supply voltage VCC2 and the negative voltage VEE2 are supplied to the power device 101 and also to VCO 113 of the gate driver 103. VCO 113 is capable of outputting a signal having a frequency corresponding to an input voltage. When the potential difference between VCC2 and VEE2 is Data2, VCO 113 outputs a signal having a frequency corresponding to Data2.

The temperature information of the temperature sensor is inputted to A/D converter 114 of the gate driver 103. When Data1 is the temperature-information, A/D converter 114 outputs a voltage-value corresponding to Data1.

The timer 112 is also called, for example, a PWM timer. PWM timer is capable of outputting a PWM having a variable duty cycle within a certain period. In the timer 112, the certain period is determined based on the period of the output signal of VCO 113, and the duty is determined based on the output signal of A/D converter 114. Therefore, the frequency of the output signal (pulse) of the timer 112 is determined by the output of VCO 113, i.e., Data2, and the duty of the output signal (pulse) of the timer 112 is determined by the output of A/D converter 114, i.e., Data1.

The output signal of the timer 112 is transmitted by the transmission circuit 110 to the receiving circuit 106 via the isolator 108. The signal received by the receiving circuit 106 is transmitted to timer 105 in MCU 101. The timer 105 is a circuit that counts the frequency and duty of the signal transmitted from the receiving circuit 106. Therefore, MCU 101 can obtain Data1 and Data2 information from the timer 105.

Figure 2:
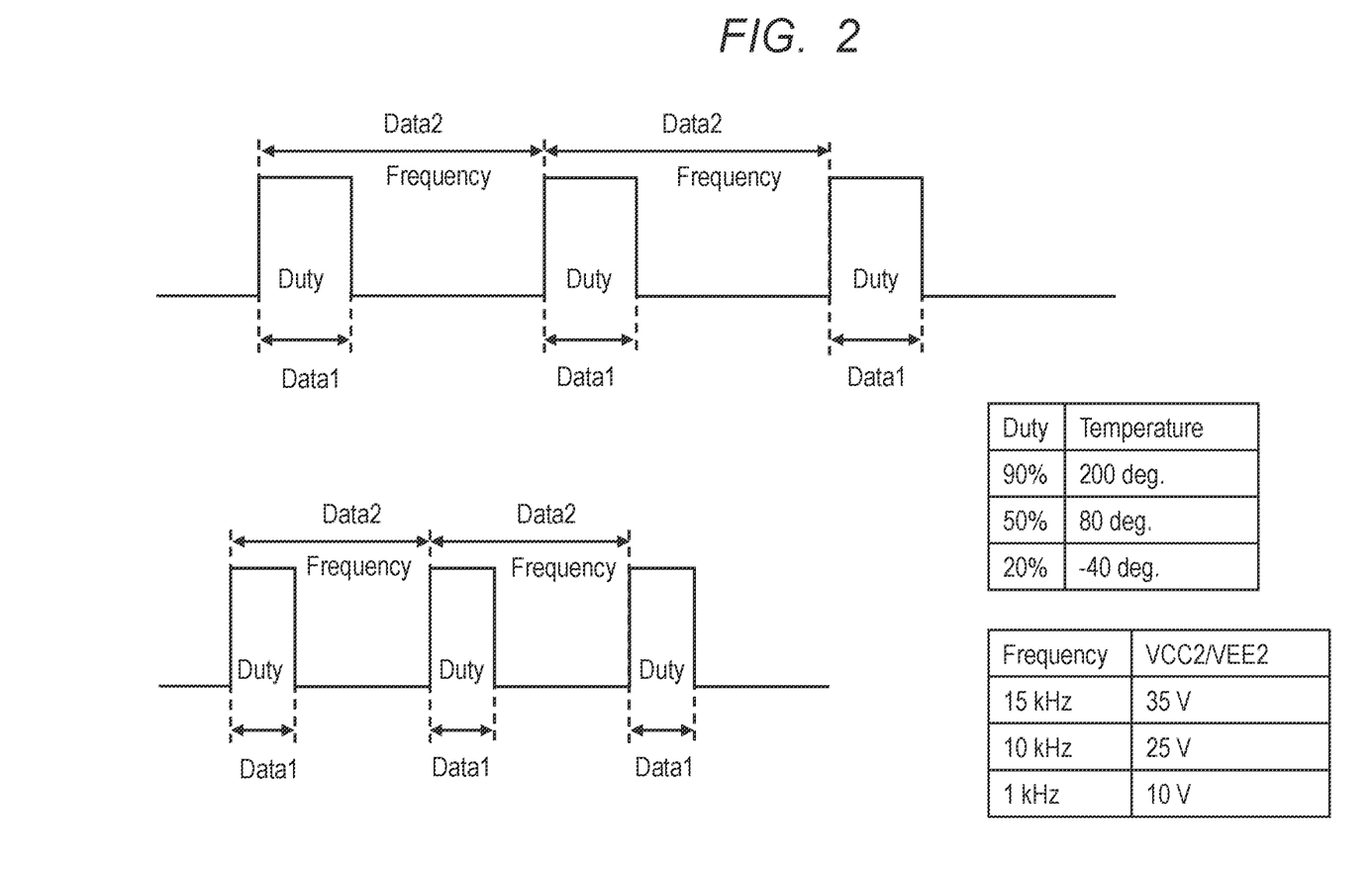
FIG. 2 is a waveform diagram for explaining an operation of the semiconductor device according to the first embodiment.

FIG. 2 is a waveform diagram for explaining the output signal of the timer 112. As shown in FIG. 2, the output signal of the timer 112 has a duty based on Data1 (temperature) and a frequency based on Data2 (a potential difference between VCC2 and VEE2). By way of example, if a correspondence between Data1 and the duty and a correspondence between Data2 and the frequency are determined in advance as shown in FIG. 2, MCU 101 can obtain the temperature information of the power device, the voltage information of VCC2 and the voltage information of VEE2 by the output signal of the timer 105.

As described above, in the gate driver 100 according to the first embodiment, the timer 112, VCO 113, and A/D converter 114 can transmit a plurality of pieces of information (temperature, VCC2, VEE2) of the power device 104 to MCU 101 by a set of a transmitting circuit, an isolator, and a receiving circuit, so that the gate driver 100 can be reduced in area and cost.

Although the potential difference between VCC2 and VEE2 is used as the voltage information of the power supply voltage VCC2 and the negative voltage VEE2, the present invention is not limited to this. When VCO 113 is operated in a time-division manner with respect to the voltages of VCC2 and VEE2, voltage data of VCC2 and VEE2 are obtained. Alternatively, a VCO 113 may be provided for VCC2 and VEE2, respectively. In these cases, Data1 will contain two types of information-VCC2 and VEE2.

Second Embodiment

Figure 3:
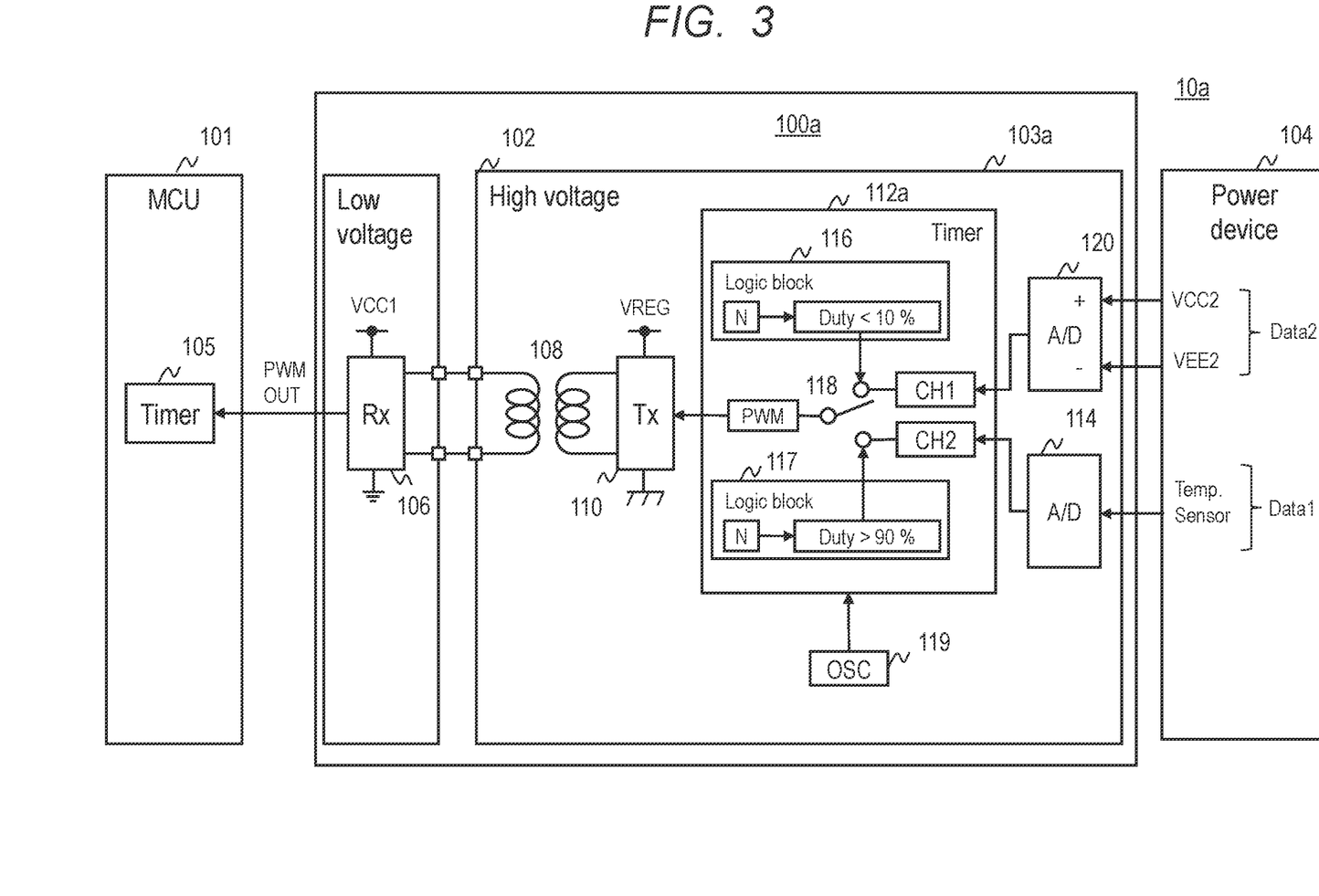
FIG. 3 is a block diagram of a semiconductor device according to second embodiment.

FIG. 3 is a block-diagram of a power device control system 10a using a semiconductor-device (gate driver) 100a according to second embodiment. A difference from the first embodiment is a timer 112a and an oscillator (OSC) 119. VCO 113 of the first embodiment is changed to A/D converter 120. In FIG. 3, the transmitting circuit 107, the isolator 109, the receiving circuit 111, and the driver circuit 115 are omitted.

The timer 112a is the PWM timer. The timer 112a is capable of outputting a PWM signal whose duty is varied in synchronization with the frequency of the signal output by OSC 119. The timer 112a includes logic circuits 116 and 117 and a switch 118. The switch 118 selects and outputs one of the output signals from the logical circuits 116 and 117 and the input channels CH1, CH2. A/D converter 120 is connected to the input channel CH1, and A/D converter 114 is connected to the input channel CH2. The duty of PWM signal outputted by the timer 112a is determined by the signal selected by the switch 118.

Each of the logic circuits 116 and 117 is a circuit for outputting a PWM signal having a predetermined number (N) of pulses with a predetermined duty. In FIG. 3, the logic circuit 116 is a circuit for outputting a PWM signal having three pulses with a duty of 10% or less. The logic circuit 117 is a circuit for outputting a PWM signal having three pulses with a duty of 90% or more. These PWM signals are used as synchronization signals when transmitting data.

As in the first embodiment, A/D converter 114 outputs a voltage-value corresponding to the temperature-information Data1 of the power device. A/D converter 120 outputs a voltage value corresponding to a potential difference (voltage) information Data2 between VCC2 and VEE2.

Next, the operation of the power device control system 10a will be described. Here, information transmission related to the power device 104 will be specifically described. As in first embodiment, the timer 112a outputs Data1 and Data2 as a PWM signal.

Figure 4:
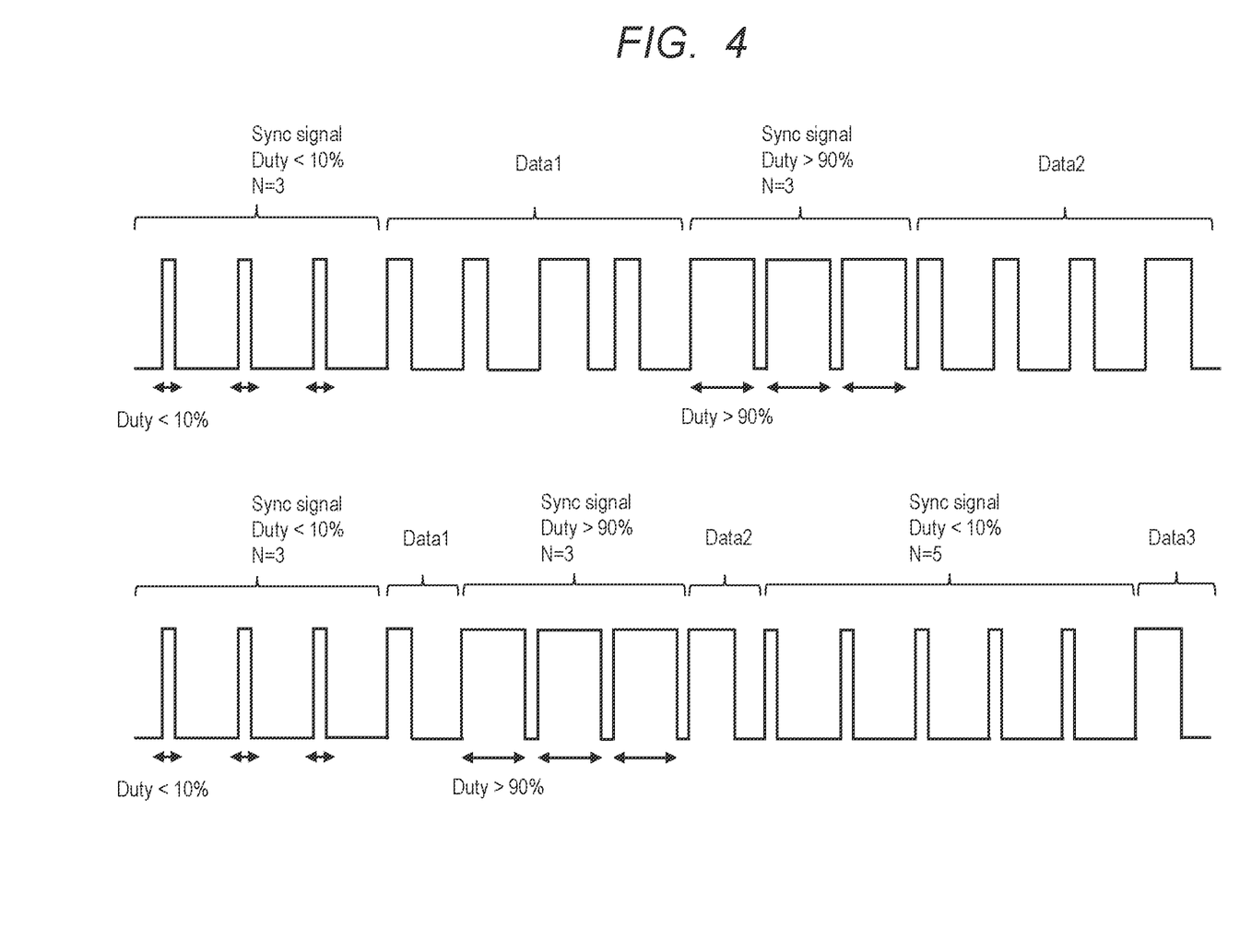
FIG. 4 is a waveform diagram for explaining an operation of the semiconductor device according to second embodiment.

Timer 112a also outputs a synchronization signal prior to outputting Data1 and Data2. FIG. 4 is a waveform diagram for explaining the output of the timer 112a. As shown in FIG. 4, the timer 112a outputs a PWM signal having three pulses with the duty of 10% or less specified by the logic-circuit 116 prior to the PWM signal corresponding to Data1. In addition, the timer 112a outputs a PWM signal having three pulses with the duty of 90% or more specified by the logic-circuit 117 prior to the PWM signal corresponding to Data2. That is, the timer 112a outputs a PWM signal having a number of pulses with the duties specified in the order of the logic circuit 116, A/D converter 120, the logic circuit 117, and A/D converter 114. This order is controlled by the switch 118.

MCU 101 recognizes the synchronization signals, and thus can reliably receive Data1 and Data2 information. That is, MCU 101 can reliably recognize that a PWM signal after receiving the PWM signal having three pulses with the duty of 10% or more is a signal indicating Data1, a PWM signal after receiving the PWM signal having three pulses with the duty of 90% or more is a signal indicating Data2.

In the above explanation, two types of information (Data1, Data2) have been described, but in the second embodiment, it is possible to cope with M (M>2) types of information. In this case, the number of A/D converters, the number of input channels of the timer, and the type of the synchronization signals (the number of logical circuits) may be increased in accordance with the number of information DataM. The waveform diagram shown in the lower part of FIG. 4 shows a case where three types of information (Data1, Data2, Data3) are transmitted in three types of synchronization signals (three pulses with a duty of 10% or less, three pulses with a duty of 90% or more, and five pulses with a duty of 10% or less).

Figure 5:
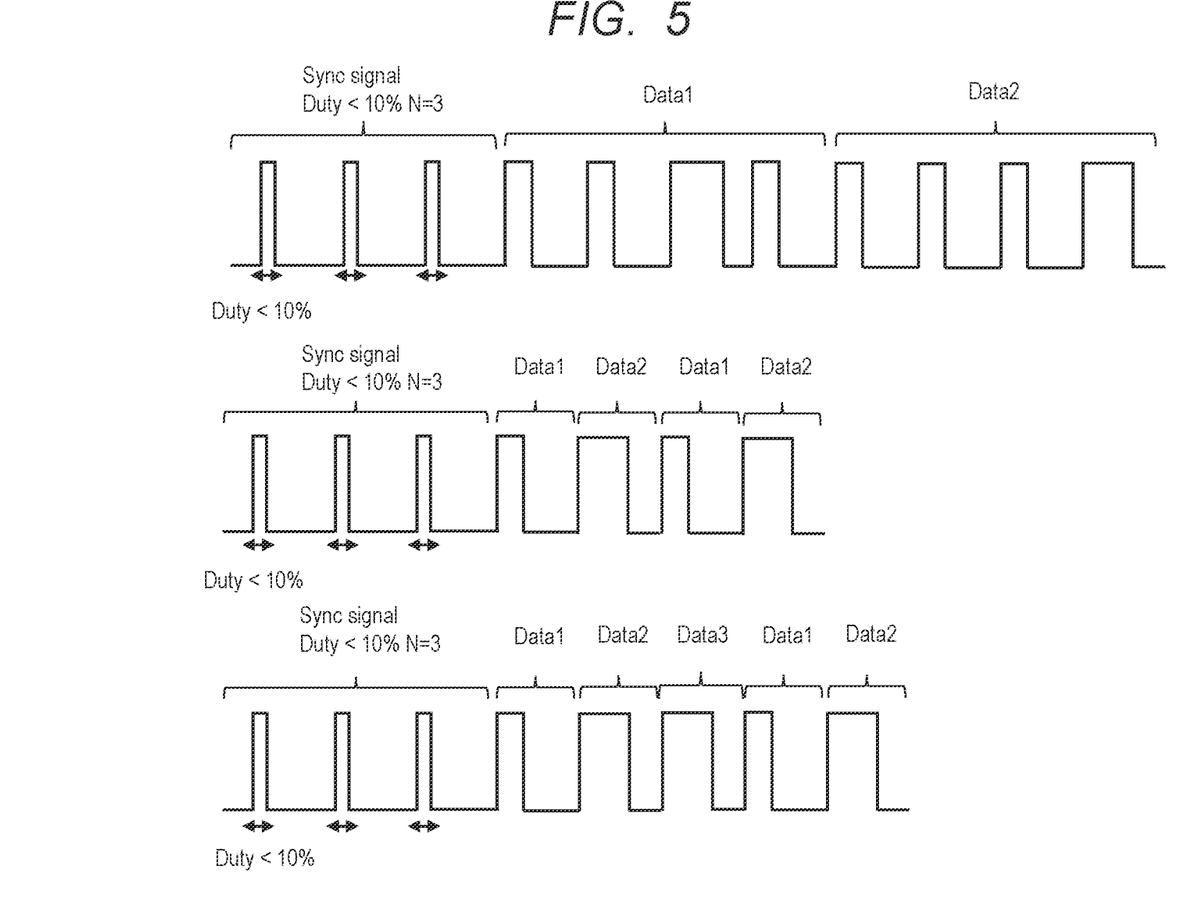
FIG. 5 is a waveform diagram for explaining an operation of the semiconductor device according to second embodiment.

In addition, the timer 112a may transmit DataM a predetermined number of times in order after transmitting the synchronization signal. FIG. 5 shows a waveform diagram (top) in which Data1, Data2 are transmitted four times after transmission of a synchronization signal having three pulses with a duty of 10% or less, a waveform diagram (middle) in which Data1 and Data2 are transmitted one time and a waveform diagram (bottom) in which Data1, Data2 and Data3 are transmitted one time.

Figure 6:
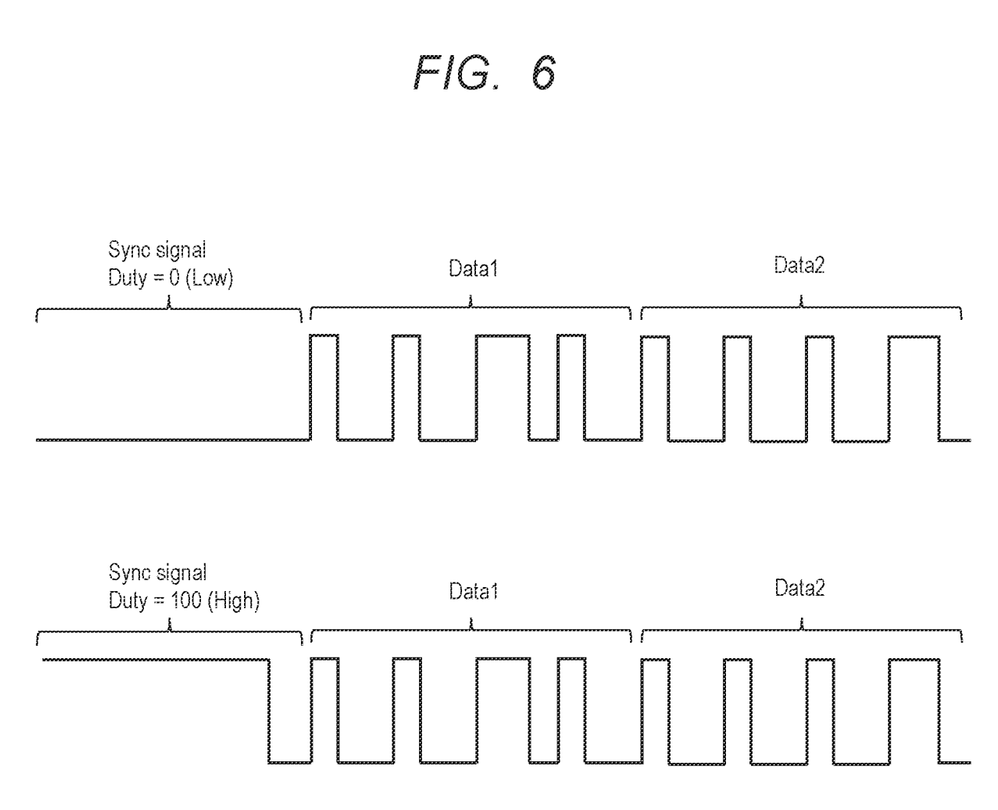
FIG. 6 is a waveform diagram for explaining an operation of the semiconductor device according to second embodiment.

The duty of the synchronization signal may be 0% (Low fixed) or 100% (High fixed). FIG. 6 shows a waveform diagram (top) in which the duty of the synchronization signal is 0% and a waveform diagram (bottom) in which the duty is 100%.

As described above, in the gate driver 100a according to the second embodiment, the synchronization signal is outputted prior to transmitting the information. This enables MCU 101 to reliably receive the data of the power device in addition to the advantages of the first embodiment.

As in the first embodiment, A/D converter 120 may be provided for VCC2 and VEE2.

Third Embodiment

Figure 7:
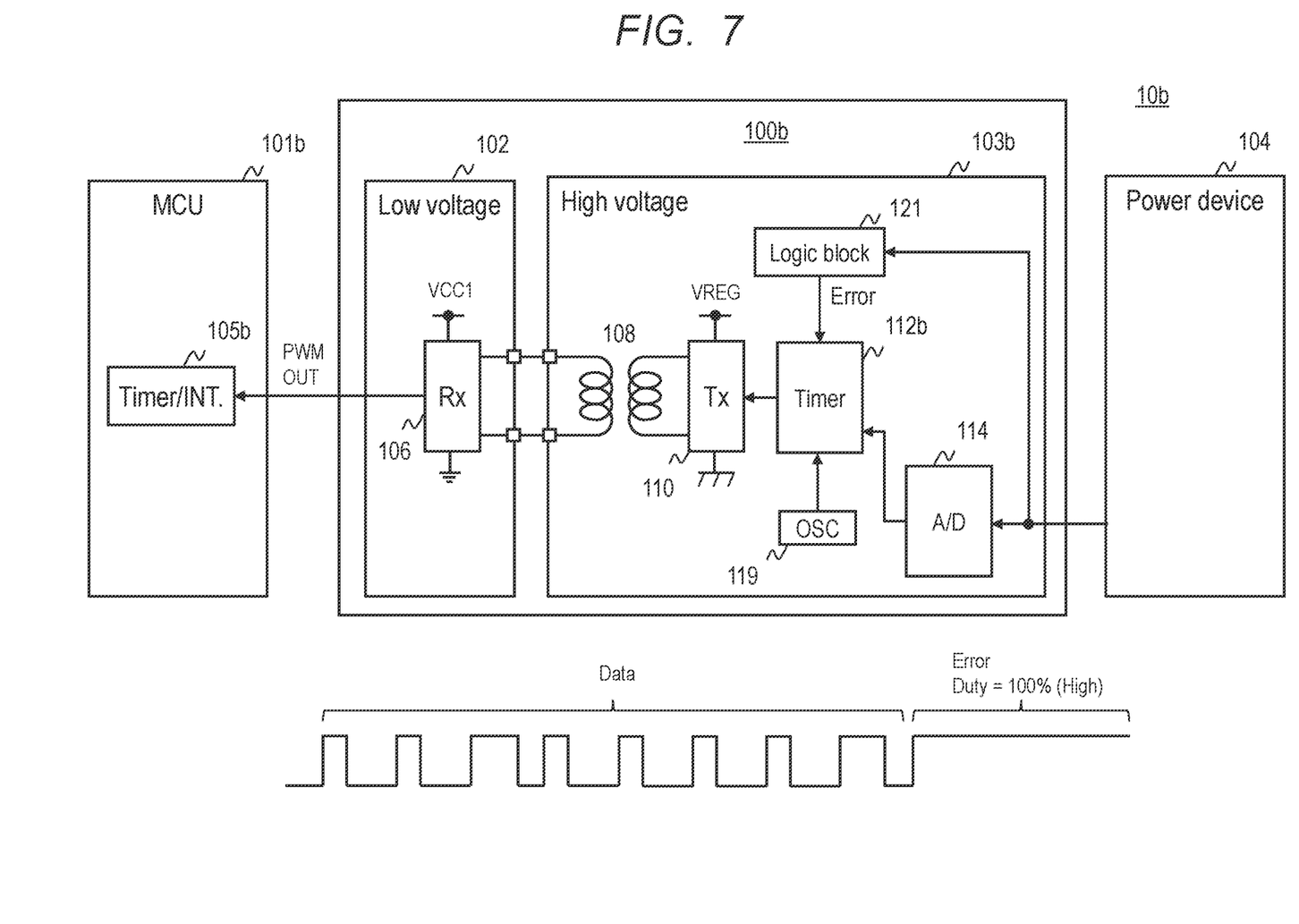
FIG. 7 is a block diagram of a semiconductor device according to third embodiment.

FIG. 7 is a block diagram of a power device control system 10b using a semiconductor device (gate driver) 100b according to third embodiment. Differences from the first embodiment are a timer 112b, OSC 119, a logic circuit 121, and a MCU 101b.

In the third embodiment, as the information to be transmitted to MCU 101b, an information generated by the gate driver 100b is also targeted in addition to the information on the power device 104. The logic circuit 121 is a circuit for monitoring, for example, a power supply voltage VCC2, a negative voltage VEE2, a temperature, a current flowing through a load, and the like of the power device, and notifying MCU 101b of an error when an abnormal value is detected. Specifically, the logic circuit 121 outputs an error signal when the value of the monitoring target exceeds the upper limit value (OVLO: Over-Voltage Lock-Out) or when the value of the monitoring target exceeds the lower limit value (LVLO: Under-Voltage Lock-Out). The logic circuit 121 may be implemented by a comparator.

A/D converter 114 converts a value of the signal to be monitored into a digital value. Note that, although only one A/D converter 114 is illustrated in FIG. 7 for the sake of simplicity, an A/D converter or a VCO can be provided for each monitoring target as in the first and second embodiments.

The timer 112b is a PWM timer and is capable of outputting a PWM signal whose duty is varied in synchronization with the frequency of the output signal of OSC 119. This duty depends on the output signal of A/D converter 114 and the output signal of the logic circuit 121. The following diagram of FIG. 7 is an exemplary output-waveform of the timer 112b. The timer 112b outputs a Data signal having a duty corresponding to the output signal of A/D converter 114, and then outputs a signal having a duty corresponding to the output signal of the logic circuit 121. Here, the Data signal is a PWM signal corresponding to Data1, Data2, Data3, DataM described in first and second embodiments. When the logic circuit 121 outputs an error, the timer 112b outputs a PWM with a duty 100% (High fixed). When the logic circuit 121 is not outputting an error, the timer 112b outputs, for example, a PWM having a duty of 0% (fixed Low). Of course, the timer 112b may output a PWM signal having a duty of 0% at the time of an error and a PWM signal having a duty of 100% at the time of a non-error. In addition, the duty at the time of error may be distinguishable from the duty of Data.

MCU 101b receives PWM signal transmitted via the transmitting circuit 110, the isolator 108, and the receiving circuit 106 by a timer/interrupt (INT.) circuit 105b. Similar to first embodiment, MCU 101b may receive a plurality of information of the power device 104. Further, MCU 101b may receive an error signal following the transmitted Data as an interrupt signal. When MCU 101b receives an interrupt, it performs a predetermined action in response to the received Data. This predetermined treatment will be described in fourth embodiment.

Figure 8:
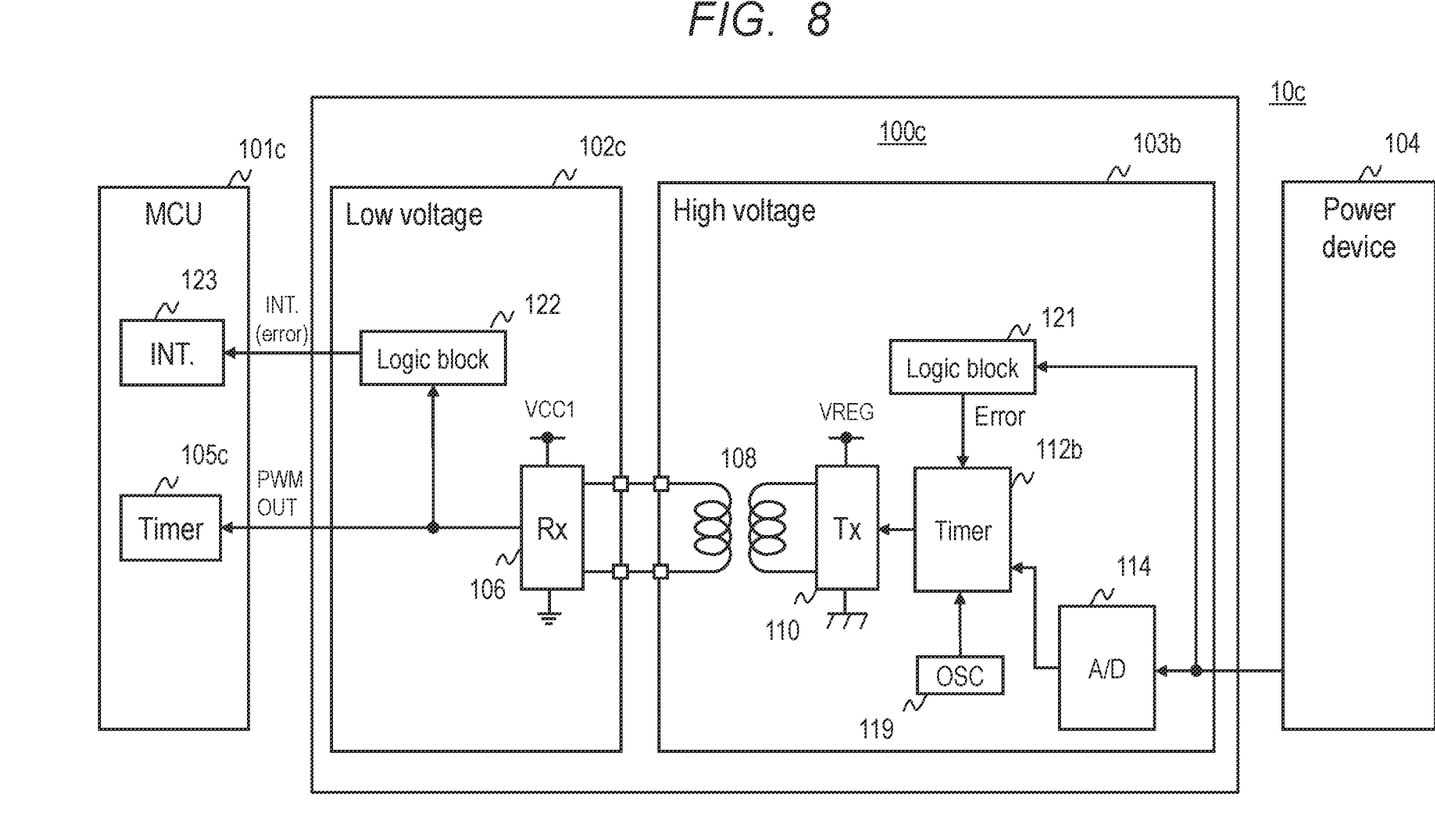
FIG. 8 is a modification of the semiconductor device according to the third embodiment.

FIG. 8 is a variation of FIG. 7. A difference from FIG. 7 is that the logic circuit 122 is added to the primary circuit 102c in the gate driver 100c. In addition, an interrupt circuit (INT.) 123 is added to MCU 101c.

The basic operation of the present modification is the same as that of the third embodiment. The logic circuit 122 determines whether a signal (pulse) having a duty of 0% or 100% is included in PWM signal transmitted from the timer 112b. If PWM signal includes, for example, a signal (pulse) having a duty of 100%, an interrupt signal is outputted to MCU 101c. When MCU 101c receives an interrupt, it performs a predetermined action in response to the received Data.

As described above, in the gate driver 100b (100c) according to the third embodiment, when the value to be monitored becomes an abnormal value, an interrupt signal is transmitted to MCU 101b (101c). MCU 101b (101c) can confirm that an anomaly has occurred in the gate driver or the power device by receiving the interrupt signal and can take a measure corresponding to the abnormality.

Fourth Embodiment

Figure 9:
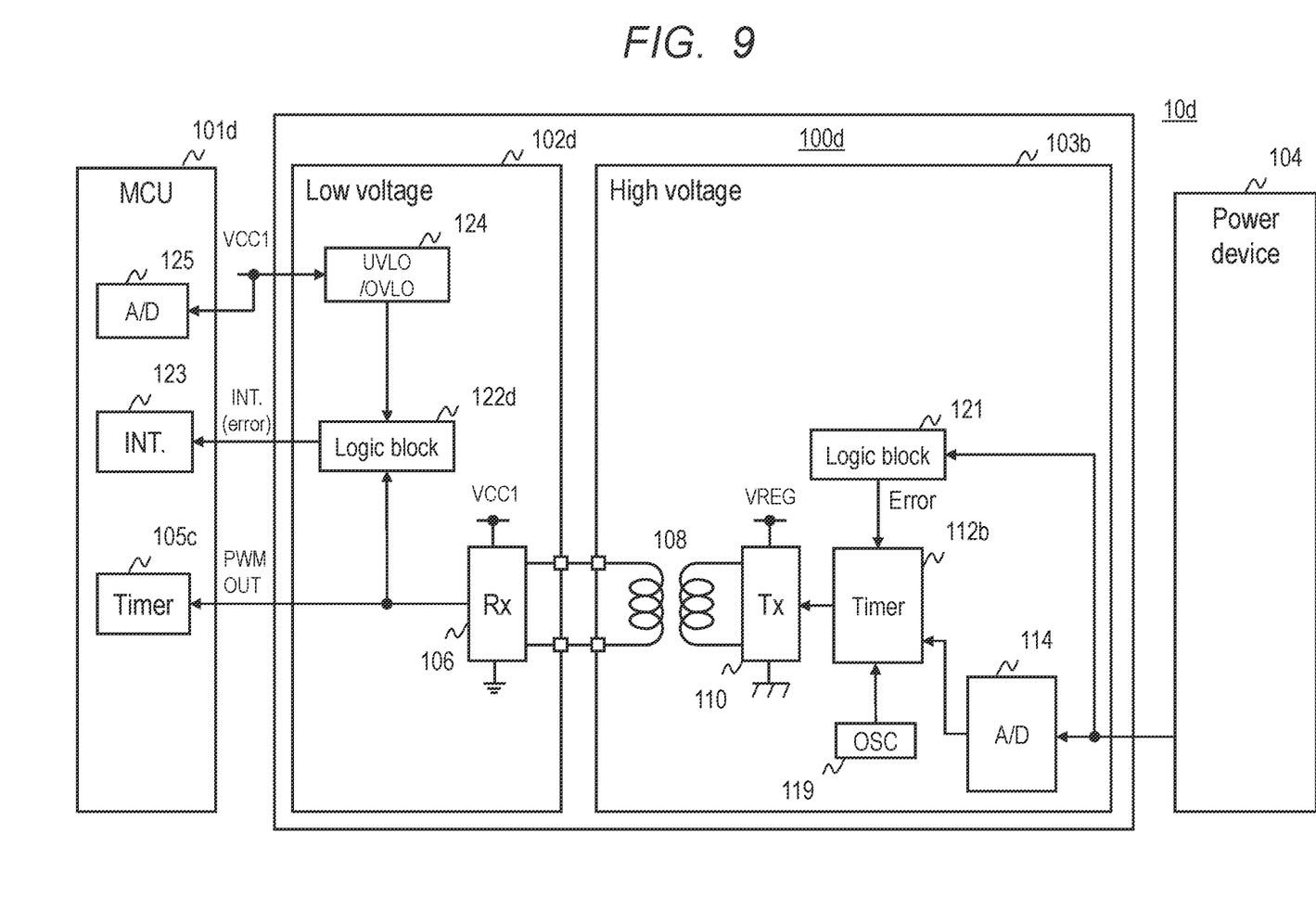
FIG. 9 is a block diagram of a semiconductor device according to fourth embodiment.

FIG. 9 is a diagram illustrating a power device control system 10d using a semiconductor device (gate driver) 100d according to fourth embodiment. First to third embodiments mainly describe techniques related to information transmission for monitoring power device. In fourth embodiment, in addition to the techniques described in first to third embodiments, a monitoring function for the secondary circuit 102d of the gate driver 100d is added.

The difference from the third embodiment is that the monitoring (UVLO/OVLO) circuit 124 is added to the primary circuit 102d of the gate driver 100d. In addition, an A/D converter 125 is added to MCU 101d.

The monitoring circuit 124 monitors the voltage of the power supply voltage VCC1 supplied to the primary circuit 102d. When the power supply voltage VCC1 exceeds the upper limit value or falls below the lower limit value, the monitoring circuit 124 outputs an error signal to the logic circuit 122d. The logic circuit 122d outputs an interrupt signal when the error signal is included in the transmitted signal from the timer 112b or when the error signal is output from the monitoring circuit 124.

A/D converter 125 converts the voltage value of the power supply voltage VCC1 into a digital value.

Next, the operation of the fourth embodiment will be described assuming that a failure (anomaly) occurs in the power device control system 10d. Failures that can occur in the power device control system 10d can be classified into failures that occur on MCU side (primary side) and failures that occur on the power device side (secondary side). As a failure occurring in MCU, for example, an error (1) in the power supply voltage VCC1 is considered. Examples of the failure occurring on the power device include an abnormality in the power supply voltage VCC2 (2), an abnormality in the negative voltage VEE2 (3), a temperature abnormality in the power device (4), and a short-circuit failure in the power device (5). By aggregating the failure data in MCU 101d, MCU 101d can do a countermeasure corresponding to each failure factor.

Figure 10:
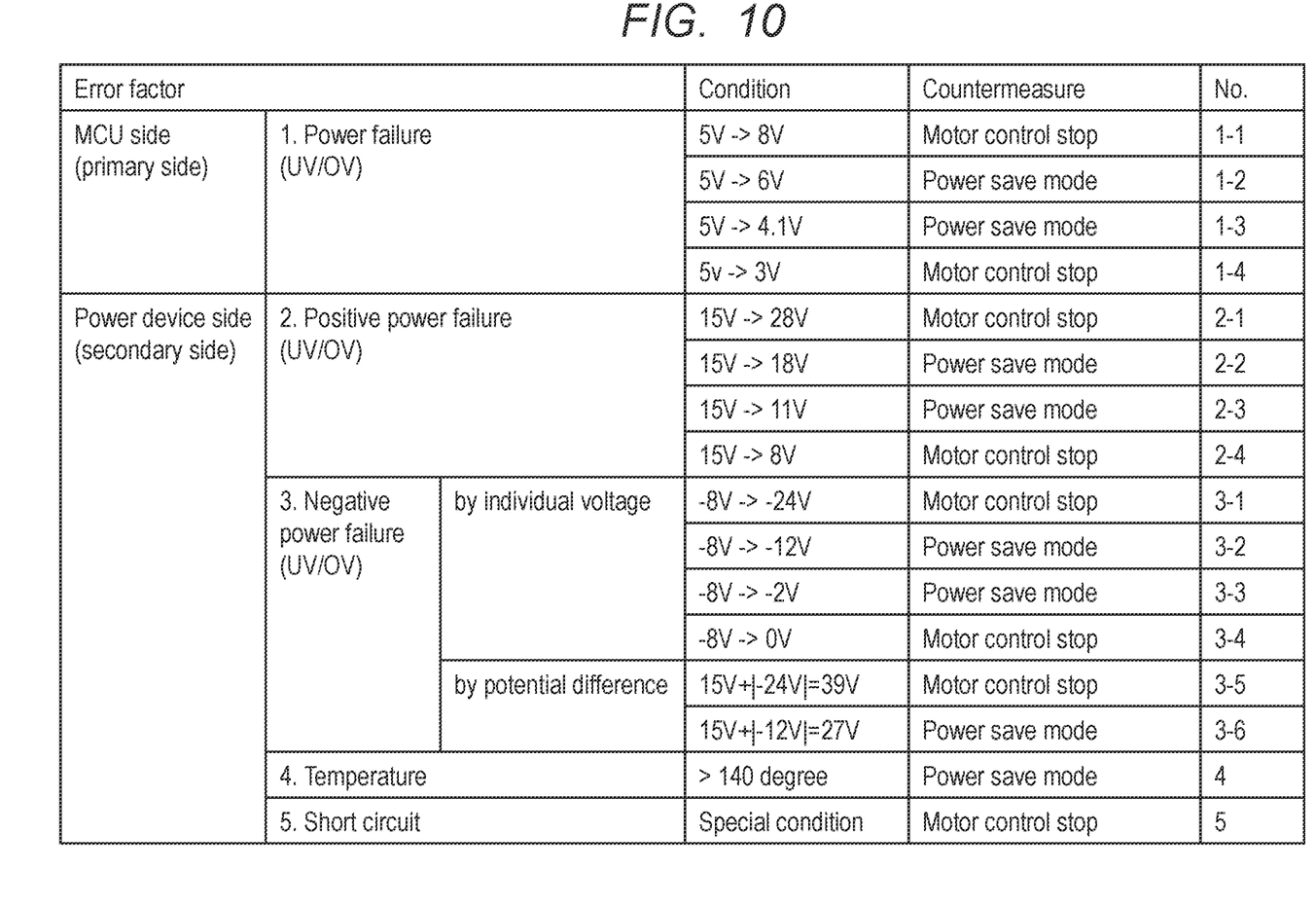
FIG. 10 is a table for describing the operation of the control system according to the fourth embodiment.
Figure 11:
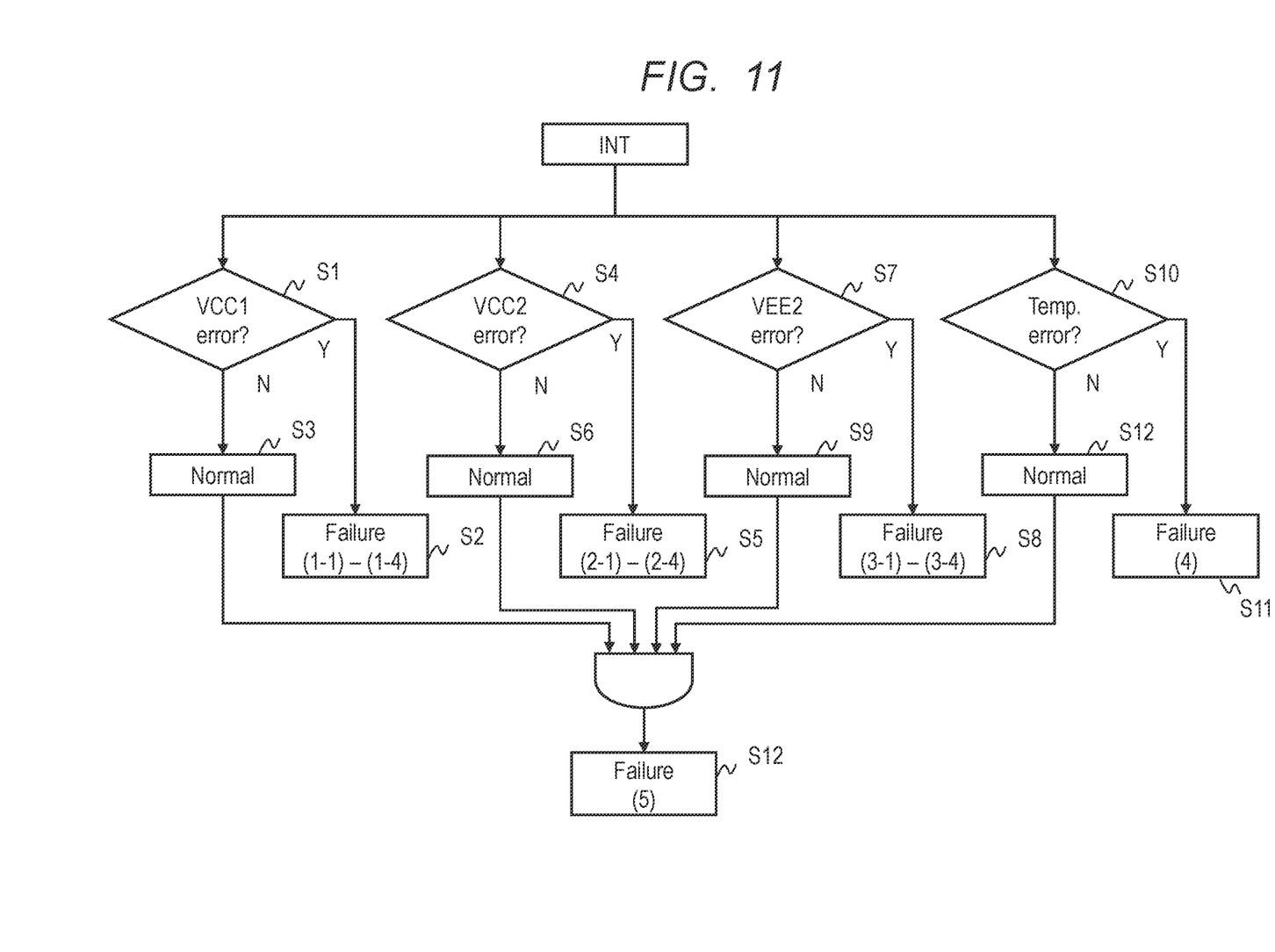
FIG. 11 is a flowchart for describing an operation of a control system according to fourth embodiment.

As described above, MCU 101d receives an interrupt signal when a failure (anomaly) is detected. Upon receiving the interrupt signal, MCU 101d determines a countermeasure method based on the transmitted information and controls the gate driver 100d based on the determined countermeasure method. FIG. 10 is a table describing failure factors that may occur in the power device control system 10d and countermeasures thereof. FIG. 11 is a flow chart illustrating how to determine the countermeasure by MCU 101d after MCU 101d receives an interrupt. Hereinafter, each item will be described. Here, a motor control system will be exemplified as a power device control system 10d.

1. Power Supply (VCC1) Anomaly

When MCU 101d receives the interrupt signal, VCC1 voltage value, i.e., the output value of A/D converter 125 is checked (S1). The normal level of VCC1 is 5V. If VCC1 is an abnormal value (S2), MCU 101d takes the following actions.

1-1. When VCC1 is 8V, the motor control is stopped.

1-2. When VCC1 is 6V, the motor is controlled in the power save mode. The power save mode is a control such that a rotation speed of the motor becomes equal to or less than a predetermined value.

1-3. When VCC1 is 4.1V, the motor is controlled in the power save mode.

1-4. When VCC1 is 3V, the motor control is stopped.

2. Power Supply (VCC2) Anomaly

When MCU 101d receives an interrupt, VCC2 transmitted from the timer 112d is checked (S4). The normal level of VCC2 is 15V. If VCC2 is an abnormal value (S5), MCU 101d takes the following actions.

2-1. When VCC2 is 28V, the motor control is stopped.

2-2. When VCC2 is 18V, the motor is controlled in the power save mode.

2-3. When VCC2 is 11V, the motor is controlled in the power save mode.

2-4. When VCC2 is 8V, the motor control is stopped.

3. Power Supply (VEE2) Anomaly

When MCU 101d receives an interrupt, VEE2 transmitted from the timer 112d is checked (S7). The normal level of VEE2 is −8V. If VEE2 is an abnormal value (S8), MCU 101d takes the following actions.

3-1. When VEE2 is-24V, the motor control is stopped.

3-2. When VEE2 is-12V, the motor is controlled in the power save mode.

3-3. When VEE2 is-2V, the motor is controlled in the power save mode.

3-4. When VEE2 is 0V, the motor control is stopped.

Note that 2 and 3 may be determined by the potential difference between VCC2 and VEE2. In this case, it is as follows.

3-5. When the potential difference is 39V, motor control is stopped.

3-6. When the potential difference is 27V, the motor is controlled in the power save mode.

4. Abnormal Temperature

When MCU 101d receives an interrupt, the temperature-information transmitted from the timer 112d is checked (S10). If the temperature is abnormal (e.g., 140 degrees or more) (S11), MCU 101d controls the motor in power save mode.

5. Short Circuit Failure

When MCU 101d receives an interrupt signal and no anomaly relating to the cases 1 to 4 is detected (Special condition), it determines that a short-circuit failure has occurred (S12). MCU 101d then deactivates the motor control.

As described above, in the power device control system 10d according to the fourth embodiment, it is possible to perform the system control based on the failure identified by specifying the failure location while suppressing the cost of the gate driver IC.

The present invention is not limited to the above-described embodiments, and various modifications can be made without departing from the gist of the present invention. It should be noted that the present invention is not limited to the above-mentioned embodiments, and various modifications can be made without departing from the gist thereof.

What is claimed is:

1. A semiconductor device comprising:

first and second isolators;

a first transmitting circuit that transmits a transmission signal via the first isolator;

a first receiving circuit that receives a received signal corresponding to the transmission signal via the first isolator;

an output driver that outputs a drive signal for driving a power device based on the received signal;

a timer that inputs first and second signals having first and second information associated with the power device, respectively, and outputs a third signal from the first and second information;

a second transmitting circuit that transmits the third signal via the second isolator; and a second receiving circuit that receives a signal corresponding to the third signal via the second isolator, wherein the third signal includes a first pulse having a duty corresponding to the first information and a second pulse having a duty corresponding to the second information.

2. The semiconductor device according to claim 1, wherein the timer outputs a synchronization pulse having a predetermined duty prior to the first pulse or the second pulse.

3. The semiconductor device according to claim 2, wherein the predetermined duty is 0% or 100%.

4. The semiconductor device according to claim 1, further comprising:
a first A/D converter,
wherein the first A/D converter generates the first signal from a signal corresponding to a temperature of the power device.

5. The semiconductor device according to claim 4, further comprising:
a voltage-controlled oscillator (VCO),
wherein the VCO generates the second signal from a power supply voltage supplied to the power device.

6. The semiconductor device according to claim 4, further comprising:
a second A/D converter,
wherein the second A/D converter generates the second signal from a power supply voltage supplied to the power device.

7. The semiconductor device according to claim 1, further comprising:
a first logic circuit that determines whether or not one of the first information and the second information includes an abnormal value,
wherein when the first logic circuit detects the abnormal value, the timer outputs an error pulse having a predetermined duty after the first and second pulses.

8. The semiconductor device according to claim 7, further comprising:
a second logic circuit that outputs an interrupt signal when the third signal includes the error pulse.

9. The semiconductor device according to claim 8, further comprising:
a monitoring circuit that monitors a power supply voltage supplied to the second receiving circuit,
wherein the second logic circuit outputs an interrupt signal when the monitoring circuit outputs an error.

10. A control system:
a power device;
a microcontroller unit (MCU); and
a semiconductor device that controls the power device according to an instruction from the MCU,
wherein the semiconductor device comprises:
first and second isolators;
a first transmitting circuit that transmits a transmission signal via the first isolator;
a first receiving circuit that receives a received signal corresponding to the transmission signal via the first isolator;
an output driver that outputs a drive signal for driving the power device based on the received signal;
a timer that inputs first and second signals having first and second information associated with the power device, respectively, and outputs a third signal from the first and second information;
a second transmitting circuit that transmits the third signal via the second isolator; and
a second receiving circuit that receives a signal corresponding to the third signal via the second isolator,
wherein the control system further comprises a first logic circuit that determines whether or not one of the first information and the second information includes an abnormal value, and
wherein when the first logic circuit detects the abnormal value, the timer outputs an error pulse having a predetermined duty after the first and second pulses.

11. The control system according to claim 10, further comprising:
a second logic circuit that outputs an interrupt signal when the third signal includes the error pulse.

12. The control system according to claim 11, further comprising:
a monitoring circuit that monitors a power supply voltage supplied to the second receiving circuit,
wherein the second logic circuit outputs an interrupt signal when the monitoring circuit outputs an error.

13. The control system according to claim 12, wherein when the interrupt signal is outputted, the MCU determines an instruction for controlling the power device based on one of the first information and the second information.

* * * * *